United States Patent
Lin et al.

(10) Patent No.: US 7,481,558 B2
(45) Date of Patent: Jan. 27, 2009

(54) LATERAL LIGHT EMITTING APPARATUS

(75) Inventors: Chih-Chia Lin, Banciao (TW); Chung-I Chiang, Pingjhen (TW); Lin-Wuu Chang, Longtan Township, Taoyuan County (TW)

(73) Assignee: Bright View Electronics Co., Ltd., Chung-Ho, Taipei Hsien (TW)

( * ) Notice: Subject to any disclaimer, the term of this patent is extended or adjusted under 35 U.S.C. 154(b) by 0 days.

(21) Appl. No.: 11/790,470

(22) Filed: Apr. 25, 2007

(65) Prior Publication Data
US 2008/0165543 A1  Jul. 10, 2008

(30) Foreign Application Priority Data
Jan. 9, 2007 (TW) .............................. 96100781 A

(51) Int. Cl.
*F21V 8/00* (2006.01)

(52) U.S. Cl. ..................... 362/346; 362/241; 362/296; 362/800

(58) Field of Classification Search ................. 362/235, 362/800, 518, 545, 241, 296, 346
See application file for complete search history.

(56) References Cited

U.S. PATENT DOCUMENTS

2005/0218801 A1 * 10/2005 Hon et al. ................... 313/512
2006/0193121 A1 * 8/2006 Kamoshita .................. 362/84

* cited by examiner

*Primary Examiner*—Laura Tso
(74) *Attorney, Agent, or Firm*—Guice Patents PLLC

(57) ABSTRACT

The present invention relates to a lateral light emitting apparatus, which comprises: a frame with a pit, and the bottom of the pit has a first spacer and a second spacer; a base disposed between the first spacer and the second spacer, and at least one side of the base has a wing that is bent and extended to the outside of the frame; a first light emitting chip; a first pad coupled to a positive electrode through a conductive wire, and at least one side of the first pad has a contact part that is bent and extended to the outside of the frame; and a second pad coupled to a negative electrode through another conductive wire, and at least one side of the second pad has a contact part that is bent and extended to the outside of the frame. With the aforementioned structure, the wing can be affixed on a Printed Circuit Board (PCB) or a heat sink in order to conduct electricity and expel heat.

19 Claims, 4 Drawing Sheets

LATERAL LIGHT EMITTING APPARATUS

BACKGROUND OF THE INVENTION

1. Field of the Invention

The present invention relates to a lateral light emitting apparatus, and more particularly, to a lateral light emitting apparatus, wherein at least one side of a base of the lateral light emitting apparatus has a wing that is bent and extended to the outside of the frame, such that the wing can expel heat directly or can be affixed on the PCB or heat sink to conduct electricity and expel heat.

2. Description of the Related Art

In the general light emitting apparatus, especially for the lateral light emitting apparatus, the heat generated by the light emitting chip is usually conducted to a wire-guided frame where the soldering point is present or to the Printed Circuit Board (PCB) through pads or terminals. If there are multiple light emitting chips on the light emitting apparatus, a heat sink pedestal or even a heat sink system must be externally installed to the wire guide frame or the lateral light emitting apparatus to expel heat. However, since the light emitting apparatus cannot expel heat and lacks a dedicated heat expelling apparatus, the aforementioned structure has the following disadvantages: (1) the temperature is rather high when multiple light emitting chips are utilized, which easily deforms the plastic frame; (2) since the heat generated by the internal packed chip is hard to discharge directly, the product yields may be greatly impacted due to the increasing ambience temperature; and (3) since the heat sink or the heat sink system is required, the manufacturing cost is inevitably increased.

SUMMARY OF THE INVENTION

Therefore, it is a main objective of the present invention to provide a lateral light emitting apparatus, wherein at least one side of a base of the lateral light emitting apparatus has a wing that is bent and extended to the outside of the frame, such that the wing can expel heat directly or can be affixed on a PCB or a heat sink to conduct electricity and expel heat.

It is another objective of the present invention to provide a lateral light emitting apparatus, in which the frame, the base, the first pad, and the second pad are integrated as a single piece to reduce the manufacturing cost of the lateral light emitting apparatus.

To achieve the foregoing objective, the present invention provides a lateral light emitting apparatus, which comprises: a frame with a pit, and the bottom of the pit has a first spacer and a second spacer; a base disposed between the first spacer and the second spacer in the pit, and at least one side of the base has a wing that is bent and extended to the outside of the frame; a first light emitting chip, which is disposed on the base and has a positive electrode and a negative electrode; a first pad disposed on one side of the first spacer and coupled to the positive electrode through a conductive wire, and at least one side of the first pad has a contact part that is bent and extended to the outside of the frame; and a second pad disposed on one side of the second spacer and coupled to the negative electrode through another conductive wire, and at least one side of the second pad has a contact part that is bent and extended to the outside of the frame.

BRIEF DESCRIPTION DRAWINGS

The accompanying drawings are included to provide a further understanding of the invention, and are incorporated in and constitute a portion of this specification. The drawings illustrate embodiments of the invention, and together with the description, serve to explain the principles of the invention.

DESCRIPTION PREFERRED EMBODIMENTS

Figure 1:
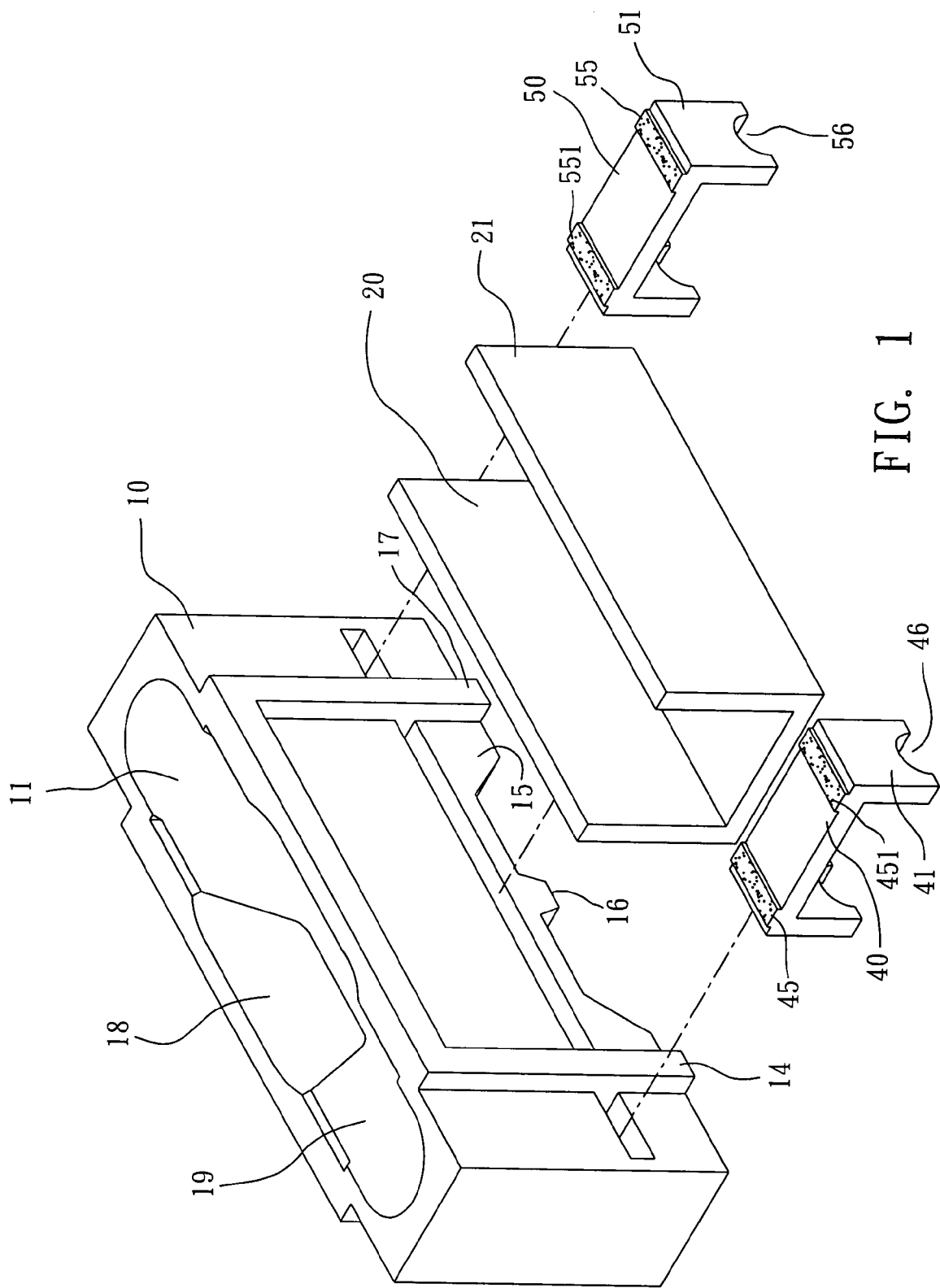
FIG. 1 is a schematic decomposition diagram of a lateral light emitting apparatus according to a preferred embodiment of the present invention.
Figure 2:
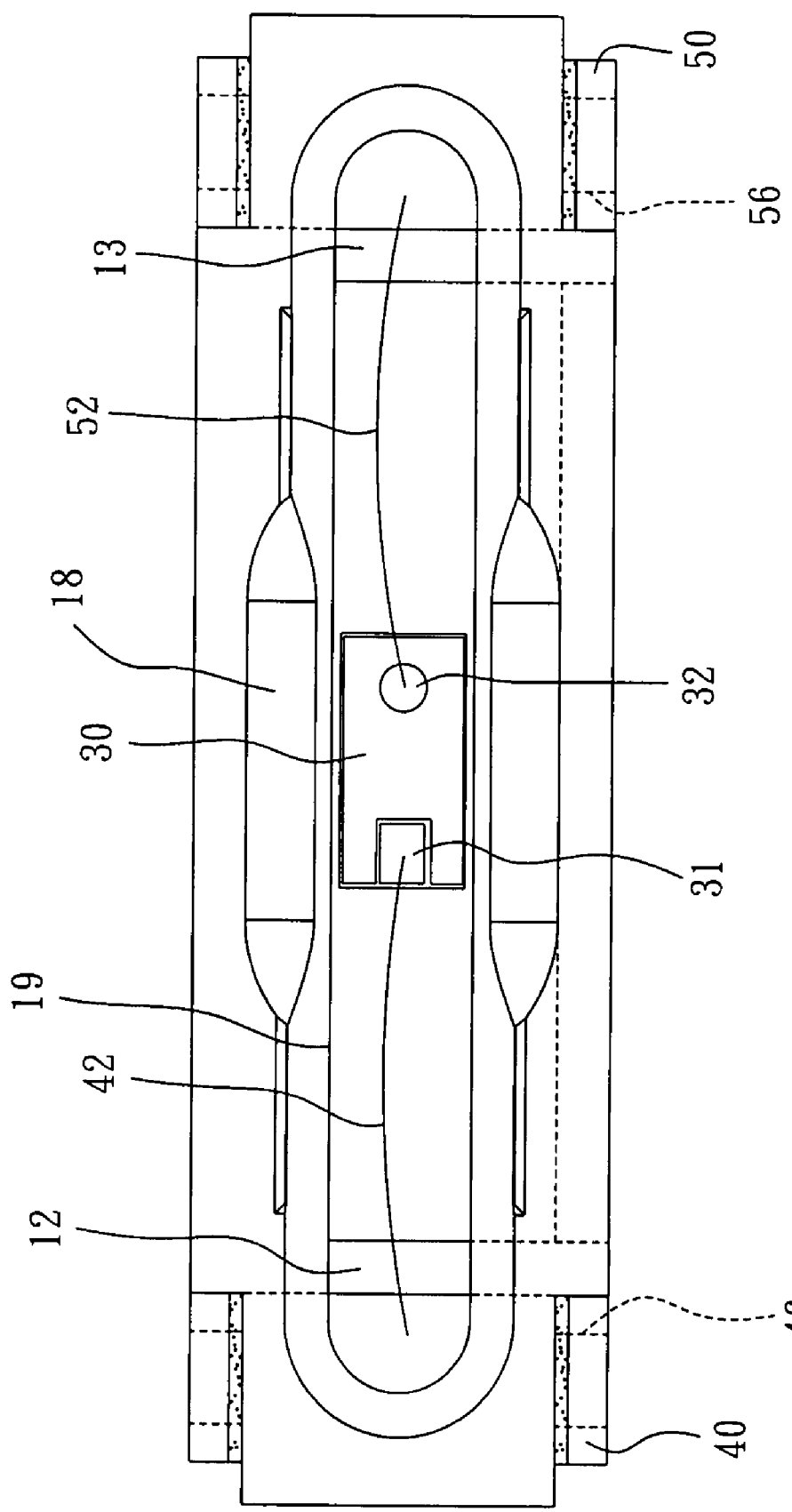
FIG. 2 is a top view of the lateral light emitting apparatus according to a preferred embodiment of the present invention after it is assembled.
Figure 3:
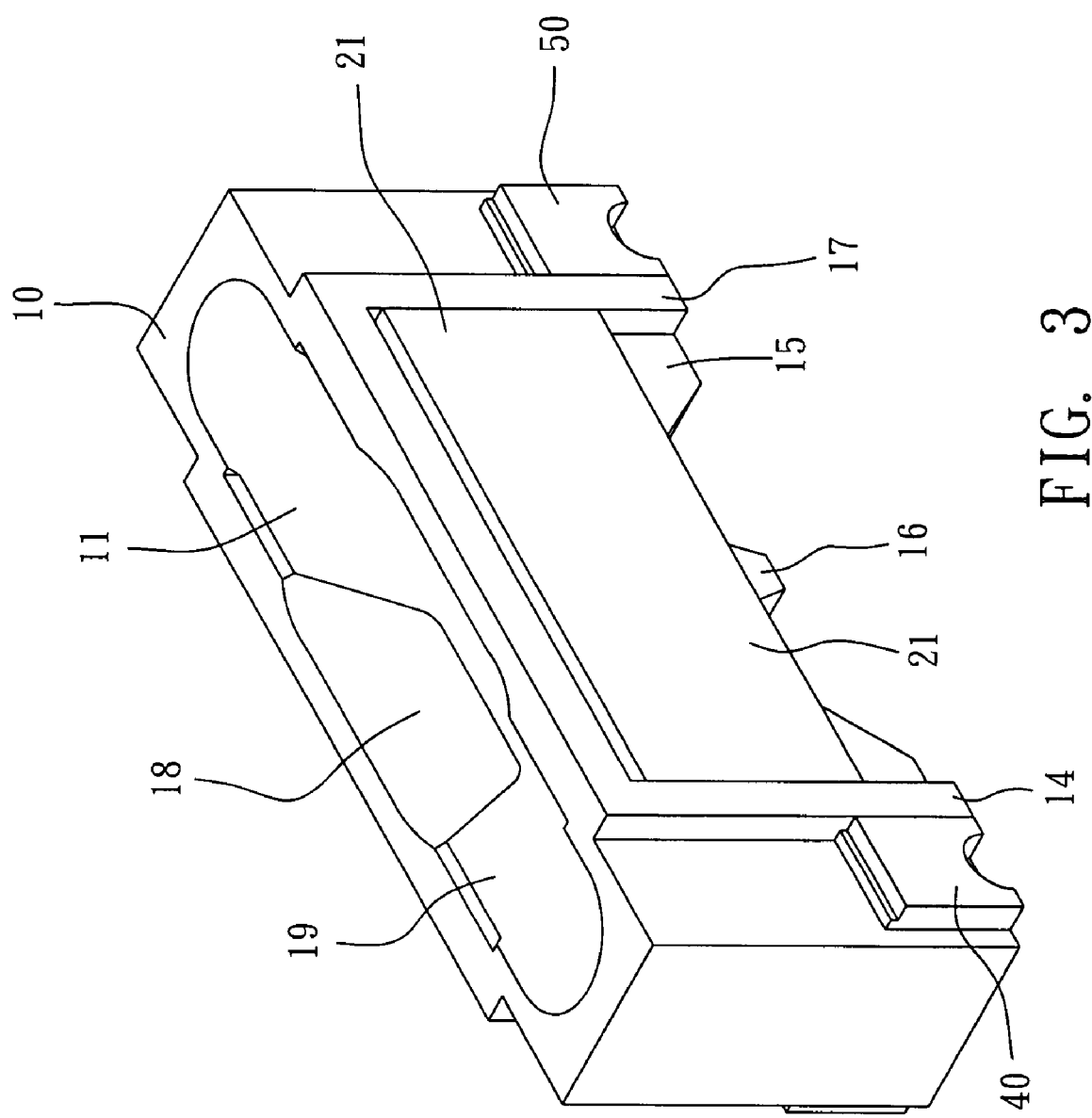
FIG. 3 is a front view of the lateral light emitting apparatus according to a preferred embodiment of the present invention after it is assembled.

Referring to FIGs. 1~3, wherein FIG. 1 is a schematic decomposition diagram of a lateral light emitting apparatus according to a preferred embodiment of the present invention; FIG. 2 is a top view of the lateral light emitting apparatus according to a preferred embodiment of the present invention after it is assembled; and FIG. 3 is a front view of the lateral light emitting apparatus according to a preferred embodiment of the present invention after it is assembled. As shown in the drawings, the lateral light emitting apparatus of the present invention comprises a frame 10, a base 20, a first light emitting chip 30, a first pad 40, and a second pad 50.

Wherein, the frame 10 is made of an insulating material, which includes, but is not limited to a plastic material. The frame 10 has a pit 11, and the bottom of the pit 11 has a first spacer 12 and a second spacer 13. The opening of the pit is for example, but not limited to be formed in a rectangle, diamond or oval shape. In the present embodiment, the opening of the pit is formed as a rectangle shape, but it is not limited to be that. In addition, both sides of the longer portion of the pit's opening respectively have an optic surface 18, and both sides of the optic surface 18 have an anti-leak surface 19. The optic surface 18 is including, but not limited to be a concave surface with a negative slope curving outwards, so as to increase the light emitting angle of the first light emitting chip 30. The anti-leak surface 19 prevents the sealed gel from leaking through the opening. In addition, the first spacer 12 and the second spacer 13 are including, but not limited to be formed as a letter "I" or "T" shape. In the present embodiment, the first and second spacers are formed as a letter "I" shape for explanation, but it is not limited to be formed as that shape.

Figure 4:
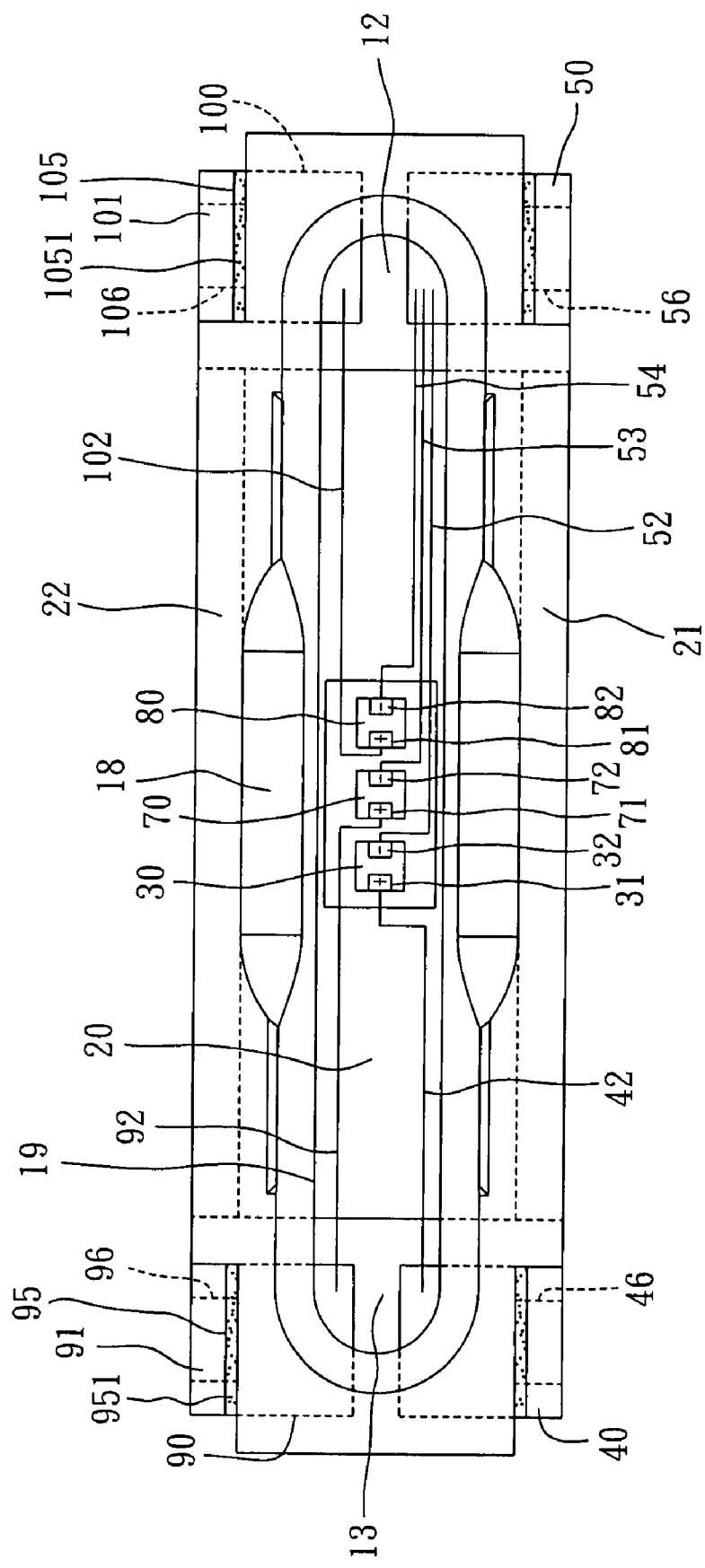
FIG. 4 is a schematic diagram of a lateral light emitting apparatus according to another preferred embodiment of the present invention.

The base 20 is made of a metal material, which is including, but not limited to be made of copper. The base 20 is disposed inside the pit 11 between the first spacer 12 and the second spacer 13. In addition, at least one side of the base 20 has a wing 21, which is bent and extended to the outside of the frame 10 for expelling heat. Wherein, the wing 21 has a flat surface, such that it can be easily affixed on a surface of a PCB (not shown) or a heat sink pedestal (not shown) in order to expel heat, so as to improve the heat expelling capability of the lateral light emitting apparatus provided by the present invention. In the present embodiment, a wing 21 that is bent and extended to the outside of the frame 10 is for example, but not limited to be disposed on one side of the base 20 for explanation. If it is required, a wing 21 can be alternatively disposed on another side of the base 20, wherein the wing 21 is bent and extended to another side of the frame 10, such that two wings 21 and 22 are respectively disposed on the top and bottom surfaces of the frame 10 (as shown in FIG. 4) to expel heat. Accordingly, the lateral light emitting apparatus of the present invention provides a better heat expelling capability.

The first light emitting chip 30 is disposed on the base 20 and comprises a positive electrode 31 and a negative electrode 32 for coupling to the first pad 40 and the second pad 50. Wherein, in the present embodiment, the first light emitting chip 30 is a single color Light Emitting Diode (LED) chip, it is including, but not limited to be a Red, Blue or Green LED chip. In addition, the first light emitting chip 30 is made of an insulating material (not shown) and is affixed on the base 20. Since this is a well known technique of the conventional LED apparatus and not the point of the present invention, its detail is intentionally omitted herein.

The first pad 40 is made of a metal material, which is including, but not limited to be made of copper. The first pad 40 is disposed on one side, for example, but not limited to the outer portion of the first spacer 12. In addition, the first pad 40 is coupled to the positive electrode 31 through a conductive wire 42, and at least one side, for example, but not limited to be two sides of the first pad 40 has a contact part 41, which is bent and extended to the outside of the frame 10, such that the lateral light emitting apparatus of the present invention can be welded on the PCB (not shown) through the contact part 41. Additionally, the first pad 40 is formed as a letter "n" shape, and at least a bulge 45 is formed on the surface of the first pad 40 in order to increase its elasticity and prevent it from being deformed. Furthermore, a plurality of raised points, depression points or rough surfaces 451 is formed on the bulge 45 in order to increase the adherence between the bulge 45 and the frame 10. The raised points 451 are exemplified in the present embodiment for explanation, but it is not limited to be the raised points 451. In addition, a curved notch 46 is formed on the bottom of the first pad 40 in order to absorb more soldering.

The second pad 50 is made of a metal material, which is including, but not limited to be made of copper. The second pad 50 is disposed on one side, for example, but not limited to the outer side of the second spacer 13. In addition, the second pad 50 is coupled to the negative electrode 32 through a conductive wire 52, and at least one side, for example, but not limited to be two sides of the second pad 50 has a contact part 51, which is bent and extended to the outside of the frame 10 and is disposed laterally opposite to the surface where the contact part 41 is disposed thereon, such that the lateral light emitting apparatus of the present invention can be welded on the PCB (not shown) through the contact part 41 and the contact part 51. Additionally, the second pad 50 is formed as a letter "n" shape, and at least a bulge 55 is formed on the surface of the second pad 50 in order to increase its elasticity and prevent it from being deformed. Furthermore, a plurality of raised points, depression points or rough surfaces 551 is formed on the bulge 55 in order to increase the adherence between the bulge 55 and the frame 10. The raised points 551 are exemplified in the present embodiment for explanation, but it is not limited to be the raised points 551. In addition, a curved notch 56 is formed on the bottom of the second pad 50 in order to absorb more soldering.

The frame 10, the base 20, the first pad 40, and the second pad 50 of the present invention are made into a single piece in order to reduce the manufacturing cost. In addition, the frame 10, the contact part 41 of the first pad 40 and the contact part 51 of the second pad 50 of the present invention are for example, but not limited to be made through a stamping process.

In addition, one side of the frame 10 of the present invention further comprises two ribs 14, which are disposed parallelly with each other and aligned to the opening of the pit 11, and the wing 21 is disposed between two ribs 14.

The bottom of the frame 10 of the present invention further comprises a locator 15, which is disposed between two ribs 14, and the tip of the locator 15 has an cusp 16. The frame 10 is aligned through the cooperation of the locator 15 and the cusp 16.

In addition, a fluorescent powder (not shown) or an encapsulated material (not shown) can be filled into the pit 11 of the present invention in order to protect the first light emitting chip 30 and the fluorescent powder. Wherein, the encapsulated material is preferably to be a transparent material, which is included but not limited to be epoxy or silica gel.

While the lateral light emitting apparatus of the present invention is being assembled, first the frame 10, the first pad 40, and the second pad 50 are placed into a mold (not shown), wherein the mold has a shape of the frame 10. Then, a plastic material is injected into the mold through an injection molding process. After the plastic is cooled down, the first light emitting chip 30 is affixed on the base 20 by using an insulating and heat expelling material. Then, the positive electrode 31 of the first light emitting chip 30 is coupled to the first pad 40 through the conductive wire 42, and the negative electrode 32 of the first light emitting chip 30 is coupled to the second pad 50 through the conductive wire 52. Afterwards, the fluorescent powder and the encapsulated material are filled into the pit 11 through the opening, such that the assembling process of the lateral light emitting apparatus of the present invention is totally completed. After the assembling process is completed, the lateral light emitting apparatus of the present invention is welded on the PCB through a SMD process, such that the first pad 40 and the second pad 50 can be used to conduct electricity and expel heat. In addition, since the wing 21 of the present invention also contacts with the PCB, when the first light emitting chip 30 is activated, the heat generated by the first light emitting chip 30 can be conducted to the PCB, such that the heat can be expelled through the wing 21. Accordingly, the heat expelling speed of the first light emitting chip 30 is improved.

FIG. 4 is a schematic diagram of a lateral light emitting apparatus according to another preferred embodiment of the present invention. As shown in the drawing, the lateral light emitting apparatus of another preferred embodiment in the present invention comprises a frame 10, a base 20, a first light emitting chip 30, a second light emitting chip 70, a third light emitting chip 80, a first pad 40, a second pad 50, a third pad 90, and a fourth pad 100.

Wherein, the structure and function of the frame 10, the base 20, the first light emitting chip 30, the first pad 40, and the second pad 50 are the same as the one described previously, thus its detail is intentionally omitted herein. However, in the present embodiment, the first spacer 12 and the second spacer 13 are formed as a letter "T" shape. In addition, two wings 21 and 22 are respectively disposed on two sides of the base 20, and the wings 21 and 22 are bent and extended to the outside of the frame 10. Two ribs 14 and 17 are respectively disposed on two sides of the frame 10. Wherein, the ribs 14 and 17 are disposed parallelly with each other and aligned to the opening of the pit 11, and the wings 21 and 22 are respectively disposed between two ribs 14 and 17.

The second light emitting chip 70 is disposed on the base 20 and on one side of the first light emitting chip 30. In addition, the second light emitting chip 70 has a positive electrode 71 and a negative electrode 72 for coupling to the third pad 90 and the second pad 50.

The third light emitting chip 80 is disposed on the base 20 and on one side of the second light emitting chip 70. In addition, the third light emitting chip 80 has a positive electrode 81 and a negative electrode 82 for coupling to the fourth pad 100 and the second pad 50.

Wherein, the first light emitting chip 30 in the present embodiment is a single color Light Emitting Diode (LED) chip, it is including, but not limited to be a Red LED. The second light emitting chip 70 in the present embodiment is a single color Light Emitting Diode (LED) chip, it is including, but not limited to be a Green LED. The third light emitting chip 80 in the present embodiment is a single color Light Emitting Diode (LED) chip, it is including, but not limited to be a Blue LED. Accordingly, the first light emitting chip 30, the second light emitting chip 70, and the third light emitting chip 80 can emit different colors of light, respectively.

Additionally, the first pad 40 and the second pad 50 are formed as a letter "]" shape, and two bulges 45 and 55 are respectively formed on the top surface of the first pad 40 and the second pad 50. Furthermore, a plurality of raised points, depression points or rough surfaces 451 and 551 is formed on the bulges 45 and 55 in order to increase the adherence between the bulges 45 and 55 and the frame 10. The third pad 90 is made of a metal material, which is including, but not limited to be made of copper. The third pad 90 is disposed on one side of the first spacer 12 and vertically opposite to one side of the first pad 40. In addition, one side of the third pad 90 has a contact part 91. For example, the contact part 91 is formed on the left side of the third pad 90, and the contact part 91 is bent and extended to the outside of the frame 10. The contact part 91 is disposed vertically opposite to one side of the contact part 41 and is coupled to the positive electrode 71 through a conductive wire 92. Additionally, the third pad 90 is formed as a letter "]" shape, and a bulge 95 is formed on the top surface of the third pad 90. Furthermore, a plurality of raised points, depression points or rough surfaces 951 is formed on the bulge 95 in order to increase the adherence between the bulge 95 and the frame 10. The raised points 951 are exemplified in the present embodiment for explanation, but it is not limited to be the raised points 951. In addition, a curved notch 96 is formed on the bottom of the third pad 90 in order to absorb more soldering.

The fourth pad 100 is made of a metal material, which is including, but not limited to be made of copper. The fourth pad 100 is disposed on one side of the second spacer 13 and vertically opposite to one side of the second pad 50. In addition, one side of the fourth pad 100 has a contact part 100. For example, the contact part 101 is formed on the left side of the fourth pad 100, and the contact part 101 is bent and extended to the outside of the frame 10. The contact part 101 is disposed vertically opposite to one side of the contact part 51 and is coupled to the positive electrode 81 through a conductive wire 102. Additionally, the fourth pad 100 is formed as a letter "]" shape, and a bulge 105 is formed on the top surface of the fourth pad 100. Furthermore, a plurality of raised points, depression points or rough surfaces 1051 is formed on the bulge 105 in order to increase the adherence between the bulge 105 and the frame 10. The raised points 1051 are exemplified in the present embodiment for explanation, but it is not limited to be the raised points 1051. In addition, a curved notch 106 is formed on the bottom of the fourth pad 100 in order to absorb more soldering.

In addition, the second pad 50 comprises the conductive wires 53 and 54, which are respectively coupled to the negative electrode 72 of the second light emitting chip 70 and the negative electrode 82 of the third light emitting chip 80, such that the lateral light emitting apparatus of the present invention can be welded on the PCB (not shown) through the contact parts 41, 51, 91 and 101. Wherein, the frame 10, the base 20, the first pad 40, the second pad 50, the third pad 90, and the fourth pad 100 of the present invention are made of a single piece, so as to reduce the manufacturing cost. In addition, the frame 10, the contact part 91 of the third pad 90 and the contact part 101 of the fourth pad 100 of the present invention are for example, but not limited to be made through a stamping process.

In summary, at least one side of the lateral light emitting apparatus provided by the present invention has a wing 21 that is bent and extended to the outside of the frame 10, such that the lateral light emitting apparatus can be affixed on a PCB or a heat sink through the wing 21 to conduct electricity and expel heat. Accordingly, the present invention effectively resolves the disadvantages of the conventional lateral light emitting apparatus.

Although the invention has been described with reference to a particular embodiment thereof, it will be apparent to one of the ordinary skills in the art that modifications to the described embodiment may be made without departing from the spirit of the invention. Accordingly, the scope of the invention will be defined by the attached claims not by the above detailed description.

What is claimed is:

1. A lateral light emitting apparatus, comprising:
   a frame with a pit, wherein the bottom of said pit has a first spacer and a second spacer;
   a base, disposed inside said pit and between said first spacer and said second spacer, wherein at least one side of said base has a wing, which is bent and extended to the outside of said frame;
   a first light emitting chip, disposed on said base and having a positive electrode and a negative electrode;
   a first pad, disposed on one side of said first spacer and coupled to said positive electrode through a conductive wire, wherein at least one side of said first pad has a contact part, which is bent and extended to the outside of said frame; and
   a second pad, disposed on one side of said second spacer and coupled to said negative electrode through another conductive wire, wherein at least one side of said second pad has a contact part, which is bent and extended to the outside of said frame.

2. The lateral light emitting apparatus of claim 1, wherein said frame is made of an insulating material, and said insulating material is a plastic material.

3. The lateral light emitting apparatus of claim 1, wherein said first spacer and said second spacer are formed as a letter "I" shape, and said first pad and said second pad are formed as a letter "n" shape in order to increase elasticity and avoid deformation, additionally at least a bulge is formed on the top surface of said first pad and said second pad, and a plurality of raised points, depression points or rough surfaces is further formed on said bulge in order to increase the adherence between said bulge and said frame.

4. The lateral light emitting apparatus of claim 3, wherein the bottom of said first pad and said second pad respectively has a curved notch in order to absorb more soldering.

5. The lateral light emitting apparatus of claim 1, wherein said first spacer and said second spacer are formed as a letter "T" shape.

6. The lateral light emitting apparatus of claim 1, wherein said base, said first pad, and said second pad are made of a metal material, said first light emitting chip is a single color Light Emitting Diode (LED) chip, and said first light emitting chip is affixed on said base through an insulating and heat expelling material.

7. The lateral light emitting apparatus of claim 1, wherein an opening of said pit is formed in a rectangle, a diamond, or an oval shape.

8. The lateral light emitting apparatus of claim 1, wherein one side of said frame further comprises two ribs, which are disposed paralelly with each other and aligned to said opening of said pit, and said wing is disposed between said two ribs.

9. The lateral light emitting apparatus of claim 6, wherein two sides opposite to said opening of said pit respectively have an optic surface, and two sides of said optic surface have an anti-leak surface, wherein said optic surface increases the light emitting angle of said first light emitting chip, and said anti-leak surface prevents a sealed gel from leaking through said opening.

10. The lateral light emitting apparatus of claim 9, wherein said optic surface is a concave surface with a negative slope curving outwards.

11. The lateral light emitting apparatus of claim 1, wherein said first pad and said second pad are aligned with the outer edge of said frame.

12. The lateral light emitting apparatus of claim 8, wherein the bottom of said frame further comprises a locator that is disposed between two ribs, and the tip of said locator has a cusp.

13. The lateral light emitting apparatus of claim 1, wherein said frame, said base, said first pad, and said second pad are made of a single piece.

14. The lateral light emitting apparatus of claim 1, wherein said base further comprises:
   a second light emitting chip, disposed on said base and on one side of said first light emitting chip, wherein said second light emitting chip has a positive electrode and a negative electrode, and said negative electrode is coupled to said second pad through a conductive wire; and
   a third light emitting chip, disposed on said base and on one side of said second light emitting chip, wherein said third light emitting chip has a positive electrode and a negative electrode, and said negative electrode is coupled to said second pad through a conductive wire.

15. The lateral light emitting apparatus of claim 14, wherein said second light emitting chip and said third light emitting chip are affixed on said base by using an insulating and heat expelling material.

16. The lateral light emitting apparatus of claim 14, further comprising:
   a third pad, disposed in said first spacer and on the vertically opposite side of said first pad, wherein said third pad is coupled to said positive electrode of said second light emitting chip, and one side of said third pad has a contact part, which is bent and extended to the outside of said frame; and
   a fourth pad, disposed in said second spacer and on the vertically opposite side of said second pad, wherein said fourth pad is coupled to said positive electrode of said third light emitting chip, and one side of said fourth pad has a contact part, which is bent and extended to the outside of said frame.

17. The lateral light emitting apparatus of claim 16, wherein a bulge is formed on the top surface of said first pad, said second pad, said third pad, and said fourth pad respectively, furthermore, a plurality of raised points, depression points or rough surfaces is further formed on the bulge in order to increase the adherence between said bulge and said frame.

18. The lateral light emitting apparatus of claim 17, wherein the bottom of said first pad, said second pad, said third pad, and said fourth pad respectively has a curved notch in order to absorb more soldering.

19. The lateral light emitting apparatus of claim 1, further comprising filling a fluorescent powder and an encapsulated material into said pit through said opening in order to protect said first light emitting chip, wherein said encapsulated material is a transparent material, which may be epoxy or silica gel

* * * * *